(12) United States Patent
Fujimura et al.

(10) Patent No.: US 8,017,288 B2
(45) Date of Patent: *Sep. 13, 2011

(54) METHOD FOR FRACTURING CIRCULAR PATTERNS AND FOR MANUFACTURING A SEMICONDUCTOR DEVICE

(75) Inventors: Akira Fujimura, Saratoga, CA (US); Michael Tucker, Los Altos, CA (US)

(73) Assignee: D2S, Inc., San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 12/540,321

(22) Filed: Aug. 12, 2009

(65) Prior Publication Data

US 2010/0055580 A1 Mar. 4, 2010

Related U.S. Application Data

(63) Continuation-in-part of application No. 12/202,364, filed on Sep. 1, 2008, now Pat. No. 7,759,026, and a continuation-in-part of application No. 12/473,241, filed on May 27, 2009, now Pat. No. 7,754,401.

(60) Provisional application No. 61/224,849, filed on Jul. 10, 2009.

(51) Int. Cl.
*G03F 9/00* (2006.01)

(52) U.S. Cl. ............... 430/30; 430/5; 430/296; 430/942

(58) Field of Classification Search .................. 430/30, 430/296, 942, 5
See application file for complete search history.

(56) References Cited

U.S. PATENT DOCUMENTS

| | | | |
|---|---|---|---|
| 4,712,013 A | 12/1987 | Nishimura | |
| 5,082,762 A | 1/1992 | Takahashi | |
| 5,804,339 A | 9/1998 | Kim | |
| 5,885,747 A | 3/1999 | Yamasaki et al. | |
| 6,049,085 A | 4/2000 | Ema | |
| 6,087,046 A | 7/2000 | Nakasuji | |
| 6,291,119 B2 | 9/2001 | Choi et al. | |
| 6,544,700 B2 | 4/2003 | Ogino | |
| 6,610,989 B1 | 8/2003 | Takahashi | |
| 6,677,089 B2 | 1/2004 | Ogino et al. | |
| 6,982,135 B2 | 1/2006 | Chang et al. | |
| 7,598,005 B2 | 10/2009 | Yamamoto | |
| 7,754,401 B2 | 7/2010 | Fujimura et al. | |
| 7,824,828 B2 | 11/2010 | Fujimura et al. | |
| 7,901,850 B2 | 3/2011 | Fujimura et al. | |
| 2002/0036273 A1 | 3/2002 | Okino | |
| 2007/0114453 A1 | 5/2007 | Emi et al. | |
| 2007/0187624 A1 | 8/2007 | Suzuki et al. | |
| 2007/0196768 A1 | 8/2007 | Ogino | |
| 2008/0116397 A1 | 5/2008 | Yoshida et al. | |
| 2008/0116398 A1 | 5/2008 | Hara et al. | |
| 2008/0116399 A1 | 5/2008 | Fujimura | |
| 2008/0118852 A1 | 5/2008 | Mitsuhashi | |
| 2008/0128637 A1 | 6/2008 | Yoshida | |

FOREIGN PATENT DOCUMENTS

| | | |
|---|---|---|
| JP | 1992155337 | 5/1992 |
| JP | 2000-66366 A | 3/2000 |
| JP | 2008066441 A | 3/2008 |
| KR | 1020080001438 A | 1/2008 |

OTHER PUBLICATIONS

International Search Report and the Written Opinion of the International Searching Authority, Application No. PCT/US/2009/053327, mailed Mar. 2, 2010.
Notice of Allowance dated Oct. 29, 2010 for U.S. Appl. No. 12/202,365.
Office Action dated Dec. 14, 2010 for U.S. Appl. No. 12/473,248.
Office Action dated Dec. 14, 2010 for U.S. Appl. No. 12/473,265.
Bloecker, M. et al., "Metrics to Assess Fracture Quality for Variable Shaped Beam Lithography", Proceedings of SPIE, vol. 6349 (2006), pp. 63490Z-1-63490Z-10, SPIE, P.O. Box 10, Bellingham, WA. 98227, U.S.A.
International Preliminary Report on Patentability and Written Opinion dated Mar. 10, 2011 for PCT Patent Application No. PCT/US2009/053327.
International Preliminary Report on Patentability and Written Opinion dated Mar. 10, 2011 for PCT Patent Application No. PCT/US2009/053328.
International Preliminary Report on Patentability and Written Opinion dated Mar. 10, 2011 for PCT Patent Application No. PCT/US2009/054229.
International Preliminary Report on Patentability and Written Opinion dated Mar. 10, 2011 for PCT Patent Application No. PCT/US2009/054239.
Notice of Allowance and Fee(s) due dated Jan. 20, 2011 for U.S. Appl. No. 12/473,265.
Notice of Allowance and Fee(s) due dated Apr. 5, 2011 for U.S. Appl. No. 12/473,248.
Office Action dated Mar. 31, 2011 for U.S. Appl. No. 12/540,328.
Office Action dated Mar. 31, 2011 for U.S. Appl. No. 12/750,709.
Office action dated on Mar. 17, 2011 for U.S. Appl. No. 12/540,322.
Office Action dated Mar. 2, 2011 for U.S. Appl. No. 12/987,994.

*Primary Examiner* — Christopher Young

(57) ABSTRACT

A method for manufacturing a semiconductor device using a photomask and optical lithography is disclosed, wherein circular patterns on the semiconductor wafer are formed by using circular patterns on the photomask, which is manufactured using a charged particle beam writer. In one embodiment, circular patterns of varying sizes have been formed on the photomask using a single character projection (CP) character, by varying the charged particle beam dosage. A method for fracturing circular patterns is also disclosed, either using circular CP characters or using VSB shots wherein the union of the plurality of VSB shots is different than the set of desired patterns.

15 Claims, 9 Drawing Sheets

METHOD FOR FRACTURING CIRCULAR PATTERNS AND FOR MANUFACTURING A SEMICONDUCTOR DEVICE

RELATED APPLICATIONS

This application: 1) is a continuation-in-part of U.S. patent application Ser. No. 12/202,364 filed Sep. 1, 2008, entitled "Method and System For Manufacturing a Reticle Using Character Projection Particle Beam Lithography" and issued as U.S. Pat. No. 7,759,026; 2) is a continuation-in-part of U.S. patent application Ser. No. 12/473,241 filed May 27, 2009, entitled "Method for Manufacturing a Surface and Integrated Circuit Using Variable Shaped Beam Lithography" and issued as U.S. Pat. No. 7,754,401; 3) claims priority from U.S. Provisional Patent Application Ser. No. 61/224,849 filed Jul. 10, 2009, entitled "Method and System for Manufacturing Circular Patterns On a Surface And Integrated Circuit"; and 4) is related to U.S. patent application Ser. No. 12/540,322 filed Aug. 12, 2009, entitled "Method and System For Forming Circular Patterns on a Surface"; all of which are hereby incorporated by reference for all purposes.

BACKGROUND OF THE DISCLOSURE

The present disclosure is related to lithography, and more particularly to the design and manufacture of a surface which may be a reticle, a wafer, or any other surface, using charged particle beam lithography.

In the production or manufacturing of semiconductor devices, such as integrated circuits, optical lithography may be used to fabricate the semiconductor devices. Optical lithography is a printing process in which a lithographic mask or photomask manufactured from a reticle is used to transfer patterns to a substrate such as a semiconductor or silicon wafer to create the integrated circuit. Other substrates could include flat panel displays or even other reticles. Also, extreme ultraviolet (EUV) or X-ray lithography are considered types of optical lithography. The reticle or multiple reticles may contain a circuit pattern corresponding to an individual layer of the integrated circuit and this pattern can be imaged onto a certain area on the substrate that has been coated with a layer of radiation-sensitive material known as photoresist or resist. Once the patterned layer is transferred the layer may undergo various other processes such as etching, ion-implantation (doping), metallization, oxidation, and polishing. These processes are employed to finish an individual layer in the substrate. If several layers are required, then the whole process or variations thereof will be repeated for each new layer. Eventually, a combination of multiples of devices or integrated circuits will be present on the substrate. These integrated circuits may then be separated from one another by dicing or sawing and then may be mounted into individual packages. In the more general case, the patterns on the substrate may be used to define artifacts such as display pixels or magnetic recording heads.

In the production or manufacturing of semiconductor devices, such as integrated circuits, maskless direct write may also be used to fabricate the semiconductor devices. Maskless direct write is a printing process in which charged particle beam lithography is used to transfer patterns to a substrate such as a semiconductor or silicon wafer to create the integrated circuit. Other substrates could include flat panel displays, imprint masks for nano-imprinting, or even reticles. Desired patterns of a layer are written directly on the surface, which in this case is also the substrate. Once the patterned layer is transferred the layer may undergo various other processes such as etching, ion-implantation (doping), metallization, oxidation, and polishing. These processes are employed to finish an individual layer in the substrate. If several layers are required, then the whole process or variations thereof will be repeated for each new layer. Some of the layers may be written using optical lithography while others may be written using maskless direct write to fabricate the same substrate. Eventually, a combination of multiples of devices or integrated circuits will be present on the substrate. These integrated circuits are then separated from one another by dicing or sawing and then mounted into individual packages. In the more general case, the patterns on the surface may be used to define artifacts such as display pixels or magnetic recording heads.

In semiconductor manufacturing, reliably manufacturing contacts and vias is difficult and important, especially when optical lithography is used to manufacture patterns smaller than 80 nm half pitch, where half pitch is one-half of the minimum contact or via size plus one-half of the minimum required space between contacts or vias. Contacts and vias connect a conductive material on one layer to another conductive material on another layer. In older technology nodes which were relatively larger than currently-popular technology nodes, attempts were made to manufacture square vias and contacts on the wafer. Square contacts and vias are desirable so as to maximize the amount of area that connects between the conductive material in the below layer and the conductive material in the above layer. But with decreasing feature sizes, it has become prohibitively expensive or impractical to create large numbers of square patterns on the semiconductor wafer. Especially at 80 nm half pitch and below, semiconductor manufacturers target forming near-circles on the wafer, when viewed from above, which create nearly cylindrical contacts or vias. The design data that specifies the desired wafer shape still specifies the desired shape as a square. However, the manufacturers and designers alike work with the assumption that limitations of the optical lithographic process will cause the actual resulting shape to be a near-circle on the wafer. The generalized case of this effect for all shapes is sometimes referred to as corner rounding.

A significant advantage to the conventional practice of specifying contacts and vias as squares in the design data is that square patterns can be formed relatively quickly on a reticle. The use of square patterns for contacts and vias on the reticle and photomask, however, make the manufacturing of vias and contacts on the semiconductor device more difficult. It would be advantageous to eliminate the manufacturing difficulties associated with using square patterns on a photomask for contacts and vias, particularly for half-pitches less than 80 nm.

SUMMARY OF THE DISCLOSURE

A method for manufacturing a semiconductor device using a photomask and optical lithography is disclosed, wherein circular patterns on the semiconductor wafer are formed by using circular patterns on the photomask, which is manufactured using a charged particle beam writer. In one embodiment, circular patterns of varying sizes have been formed on the photomask using a single character projection (CP) character, by varying the charged particle beam dosage.

A method for fracturing circular patterns is also disclosed, either using circular CP characters or using variable shaped beam (VSB) shots wherein the union of the plurality of VSB shots is different than the set of desired patterns.

These and other advantages of the present disclosure will become apparent after considering the following detailed specification in conjunction with the accompanying drawings.

DETAILED DESCRIPTION OF THE EMBODIMENTS

Figure 1:
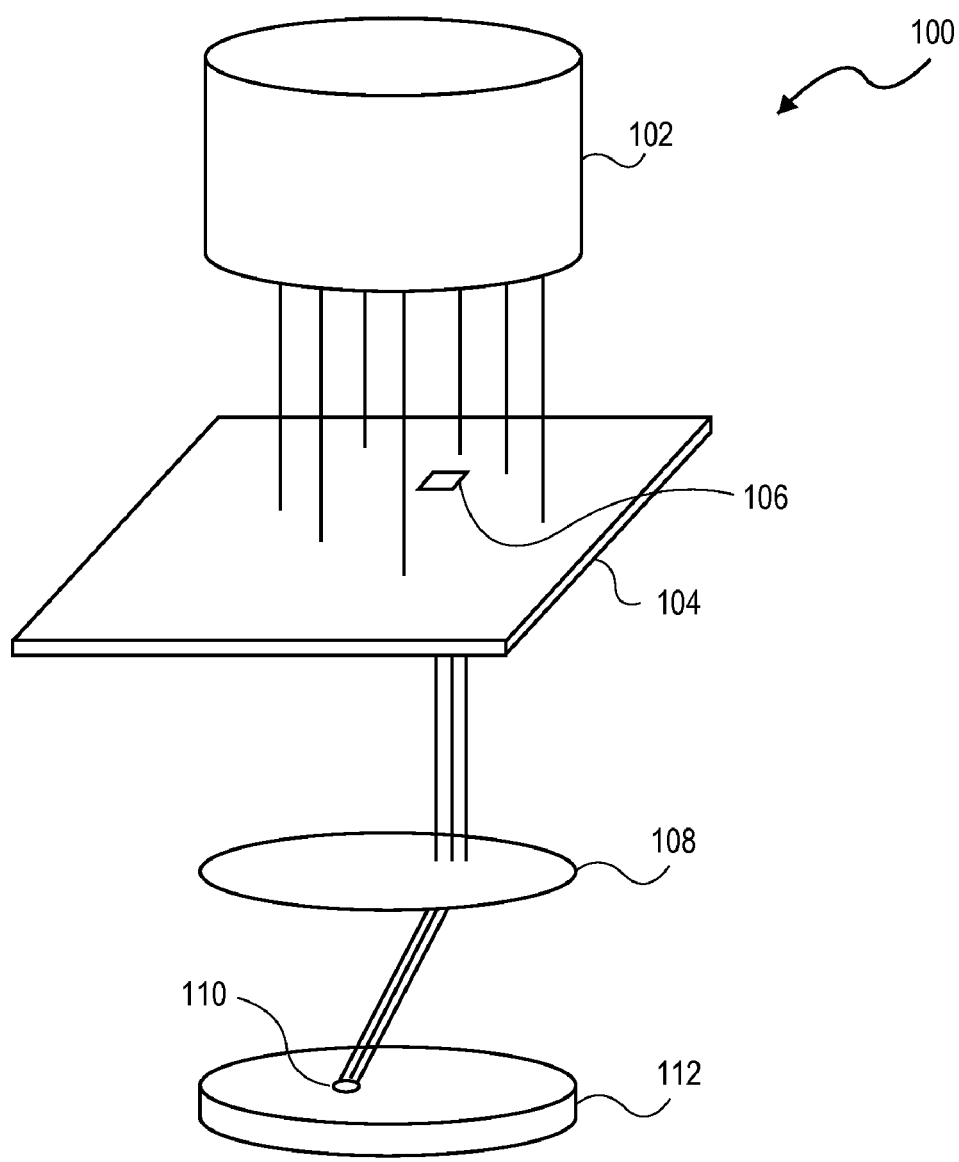
FIG. 1 illustrates a conventional method of forming circular patterns such as contacts or vias on a wafer.

FIG. 1 illustrates the conventional practice for forming contact and via patterns on a wafer using optical lithography. An optical lithography machine 100 comprises an illumination source 102 which emits optical radiation onto a photomask 104 containing a multiplicity of rectangular aperture patterns 106. Optical radiation is transmitted through the aperture pattern 106 and through one or more lenses 108, thereby forming a pattern 110 on a surface 112, such as a semiconductor wafer. The pattern 110 on the surface 112 is generally reduced in size compared to the aperture pattern 106 on the photomask 104. Due to limitations of the optical lithography process, such as the wavelength of the radiation created by the illumination source 102, for small contact and via patterns, such as for patterns smaller than 80 nm half pitch, the square pattern on the photomask causes a circular or near-circular pattern to be formed on the substrate.

There is an important concept called Mask Error Enhancement Factor (MEEF) in semiconductor lithography. In a typical semiconductor manufacturing process using photomasks, the photomasks are four times the dimensions of the wafer. For example, a 50 nm target shape on a surface appears as a 200 nm shape on the photomask. If MEEF was 1.0, a 4 nm offset error on the photomask would translate to a 1 nm offset on the wafer. However, a typical MEEF for lines and spaces, such as on interconnect or wiring layers, is 2. For contact layers, a typical MEEF is 4, which means that a 4 nm offset error on the photomask translates to a 4 nm offset on the wafer. In advanced technology nodes with contacts layers which are less than 80 nm half-pitch, a MEEF as high as 10 may be projected. In such a case a 4 nm offset on the photomask translates into a 10 nm offset on the wafer. Thus photomasks, and particularly photomasks for contact layers, are required to be extremely accurate in order that the MEEF-multiplied error on the surface does not exceed the maximum-allowed error.

One known method for improving MEEF is the so-called perimeter rule. The perimeter rule states that for a given enclosed shape, a higher ratio of the shape's perimeter to the shape's area results in a larger MEEF. In semiconductor manufacturing, it is most important in the lithography step to expose the resist with the right amount of total energy for each shape on the mask. Therefore, for each pattern or shape, accuracy is more important for the total area than the other dimensions of the pattern or shape. Various sources of error in the semiconductor manufacturing processes act on the perimeter, which are the set of edges that enclose the shape. These edges may move inward or outward compared to the desired location. When the ratio of the perimeter to the area is relatively large, the entire perimeter moving inwards by a given distance, say 1 nm, shrinks the enclosed area by a larger amount than if the ratio was relatively smaller. Because total area is total energy, and the total energy is critical for each shape, a smaller ratio is desired for every shape. Among geometric shapes, a circle has the smallest perimeter per unit area of any shape. Therefore, circular shapes or patterns will have a smaller MEEF than any non-circular shape. Nearly-circular shapes will have a MEEF that is almost optimal.

Figure 2:
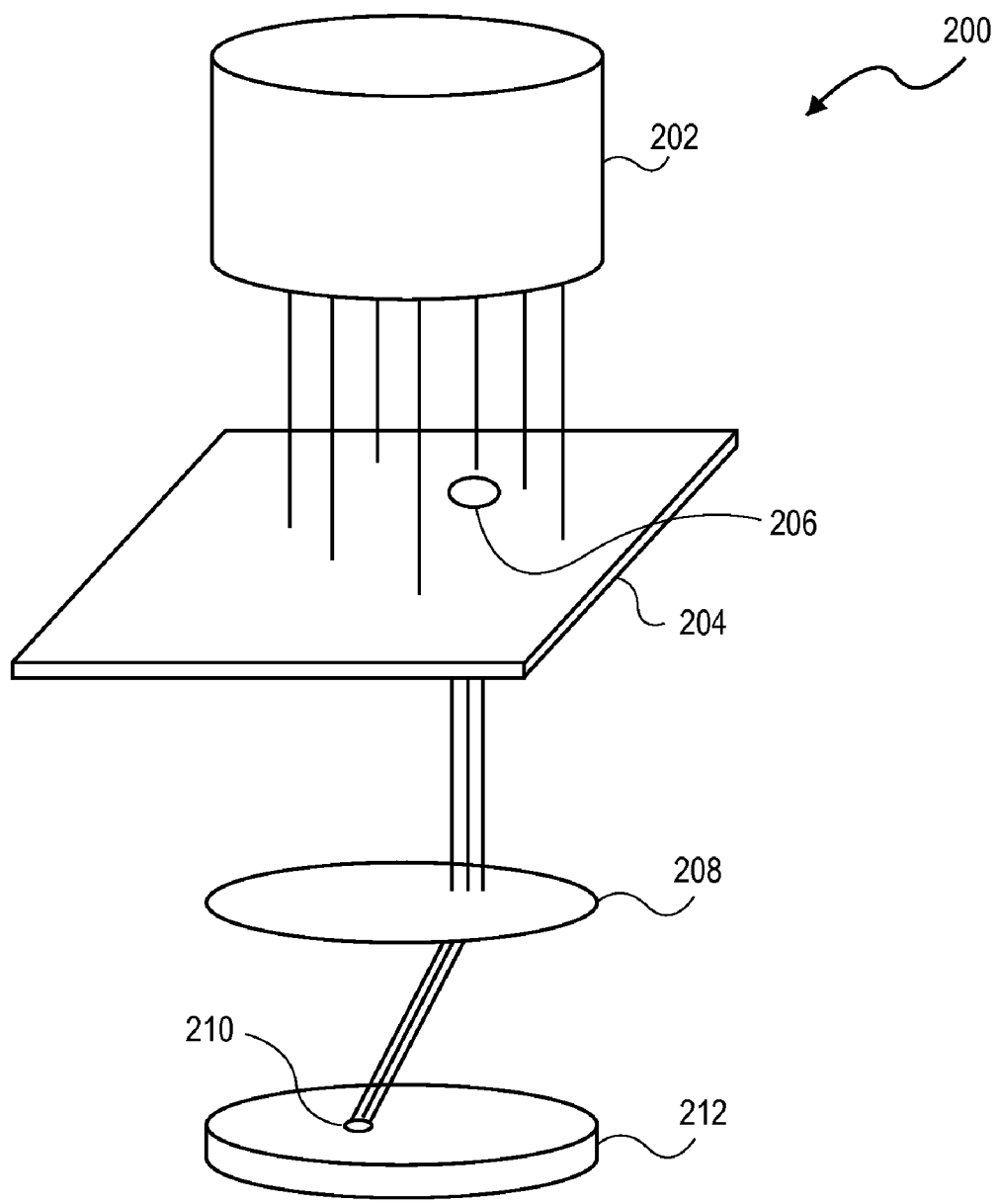
FIG. 2 illustrates a method of forming circular patterns such as contacts or vias on a wafer by the current disclosure.

FIG. 2 illustrates how contacts or vias can be created on the silicon wafer by the current disclosure. An optical lithography machine 200 comprises an illumination source 202 which emits optical radiation onto a photomask 204 containing a multiplicity of circular aperture patterns 206. Optical radiation is transmitted through the aperture pattern 206 and through one or more lenses 208, thereby forming a pattern 210 on a surface 212, such as a semiconductor wafer. Because of the above-mentioned perimeter rule, use of the circular or near-circular aperture 206 on the photomask 204 results in a lower (better) MEEF than use of the square aperture 106 on the photomask 104 of FIG. 1.

Mask making today is done by either a laser-based mask writer, or a charged particle beam mask writer, such as an electron beam mask writer. Today's production tools for the most advanced technology nodes with the smallest features below 80 nm half pitch are all done using an electron beam mask writer using variable shaped beam (VSB) technology with a high voltage (50 KeV and above) electron gun. Conventional reticle or mask writing includes a step of fracturing all desired mask shapes into constituent rectangles and 45 degree triangles of a certain size limit (for example, between 1 nm wide and 1000 nm wide) such that the union of all shapes is the original shape, perhaps within a certain minimum threshold, and such that the constituent shapes do not overlap. The fractured shapes are individually written by the electron beam mask writer as VSB shots. Reticle writing typically involves multiple passes whereby the given shape on the reticle is written and overwritten. Typically, two to four passes are used to write a reticle to average out errors, allowing the creation of more accurate photomasks. Conventionally, within a single pass the constituent shapes do not overlap. In reality, because electron beam mask writers are not perfectly accurate, some VSB shots that were designed to abut will overlap slightly. Also, between some VSB shots that were designed to abut there will be minute gaps. The electron beam mask writer's placement accuracy and the semiconductor design are carefully coordinated to avoid problems that arise due to these overlaps and gaps. The problems that arise are minimal particularly for small errors of 1 nm or below because the electron beam being transmitted has a natural blurring radius (roughly of 20-30 nm size), causing a Gaussian distribution of transferred energy beyond the drawn edges of the shapes. The dose for each of the VSB shots is assigned in a later and separate step. The dose determines the shutter speed, or the amount of time that the electrons are being transmitted to the surface. Proximity Effect Correction and other corrective measures determine what doses should be applied to each VSB shot to make the resulting photomask shape as close to the originally-desired photomask shape as possible.

Conventionally, one VSB shot is required for forming a square contact or via pattern. Forming a circular pattern on a reticle using conventional mask writing technology requires many VSB shots. Increasing the number of VSB shots has a direct impact on the amount of time required to write the reticle, which directly translates to photomask cost. Since for a typical integrated circuit design, many million contact and via patterns must be formed, the formation of circular contact or via patterns on a reticle using conventional VSB shots is not considered practical.

Figure 7:
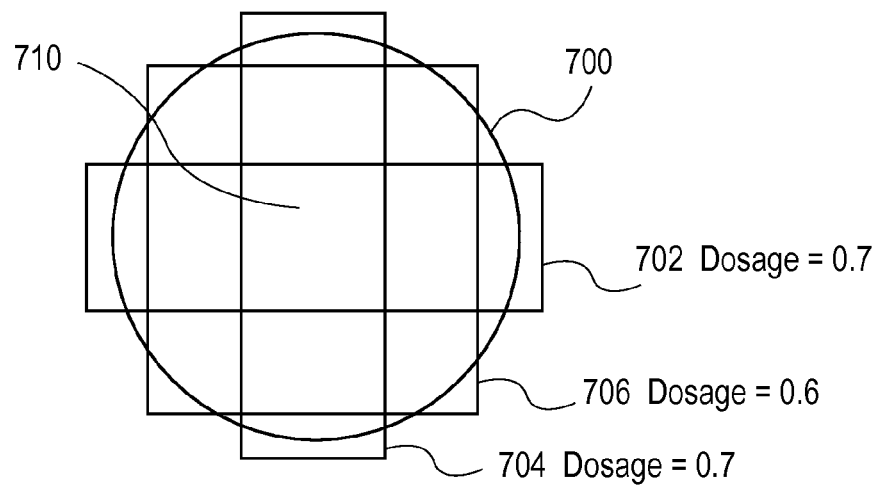
FIG. 7 illustrates how overlapping VSB shots may be used to write a circular pattern.

FIG. 7 illustrates an example of how a small circular pattern 700 may be formed on a surface such as a reticle by the current disclosure using multiple overlapping VSB shots. In the FIG. 7 example three VSB shots—rectangular shot 702, rectangular shot 704 and square shot 706—are shown. Use of overlapping shots allows the pattern to be written with fewer VSB shots than would be required with conventional methods. The technique of overlapping shots is particularly effective for small circles where the blur of the charged particle beam caused by forward scattering of the charged particles, Coulomb effect, and other physical, chemical, and electromagnetic effects is of the same order of magnitude as the diameter of the circle. As can be seen in FIG. 7, the union of the three VSB shots, shot 702, shot 704 and shot 706, does not equal the target circular pattern 700. The dosage of each shot is shown as a fraction of the "normal" VSB dose: shot 702 and shot 704 have dosages of 0.7 times normal, and shot 706 has a dosage of 0.6 times normal. As shown, the total dosage summed from all shots in the middle 710 of the circle 700 is therefore 2.0 times normal. Some mask fabrication processes have a maximum dosage limit, such as 2.0 or twice the normal dosage. To compensate for the lower-than-normal shot dosages, the VSB shot boundaries for shots 702, 704, and 706 are extended beyond the boundary of the target circle 700. Charged particle beam simulation may be used to calculate the pattern that will be formed on the surface, so as to verify that the resultant pattern is within a desired tolerance of the target circular pattern 700.

Figure 8:
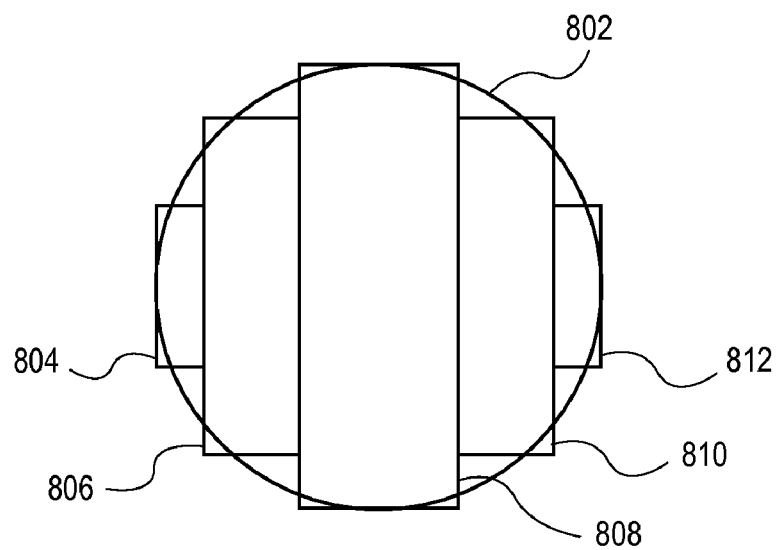
FIG. 8 illustrates how non-overlapping VSB shots may be used to write a circular pattern.

FIG. 8 illustrates an example of how a small circular pattern 802 may be formed on a surface such as a reticle by the current disclosure using multiple non-overlapping VSB shots. In this example, five shots are used: shot 804, shot 806, shot 808, shot 810 and shot 812. As can be seen, the union of the shots 804, 806, 808, 810 and 812 is different than the target pattern 802. The use of five shots to fill the pattern still represents a reduced shot count compared to conventional methods, in which shots are generated to match the boundary of the target circular pattern as closely as possible. In the FIG. 8 example the shot boundaries do not extend as far beyond the boundary of the target circular pattern as in the FIG. 7 example because the dosages of the FIG. 8 individual VSB shots can be made higher than the dosages of the FIG. 7 VSB shots without concern of exceeding a maximum dosage limit, since the VSB shots in the FIG. 8 example do not overlap. As with the example of FIG. 7, charged particle beam simulation may be used to calculate the pattern that will be formed on the surface, so as to verify that the resultant pattern is within the desired tolerance of the target circular pattern 802.

Figure 3:
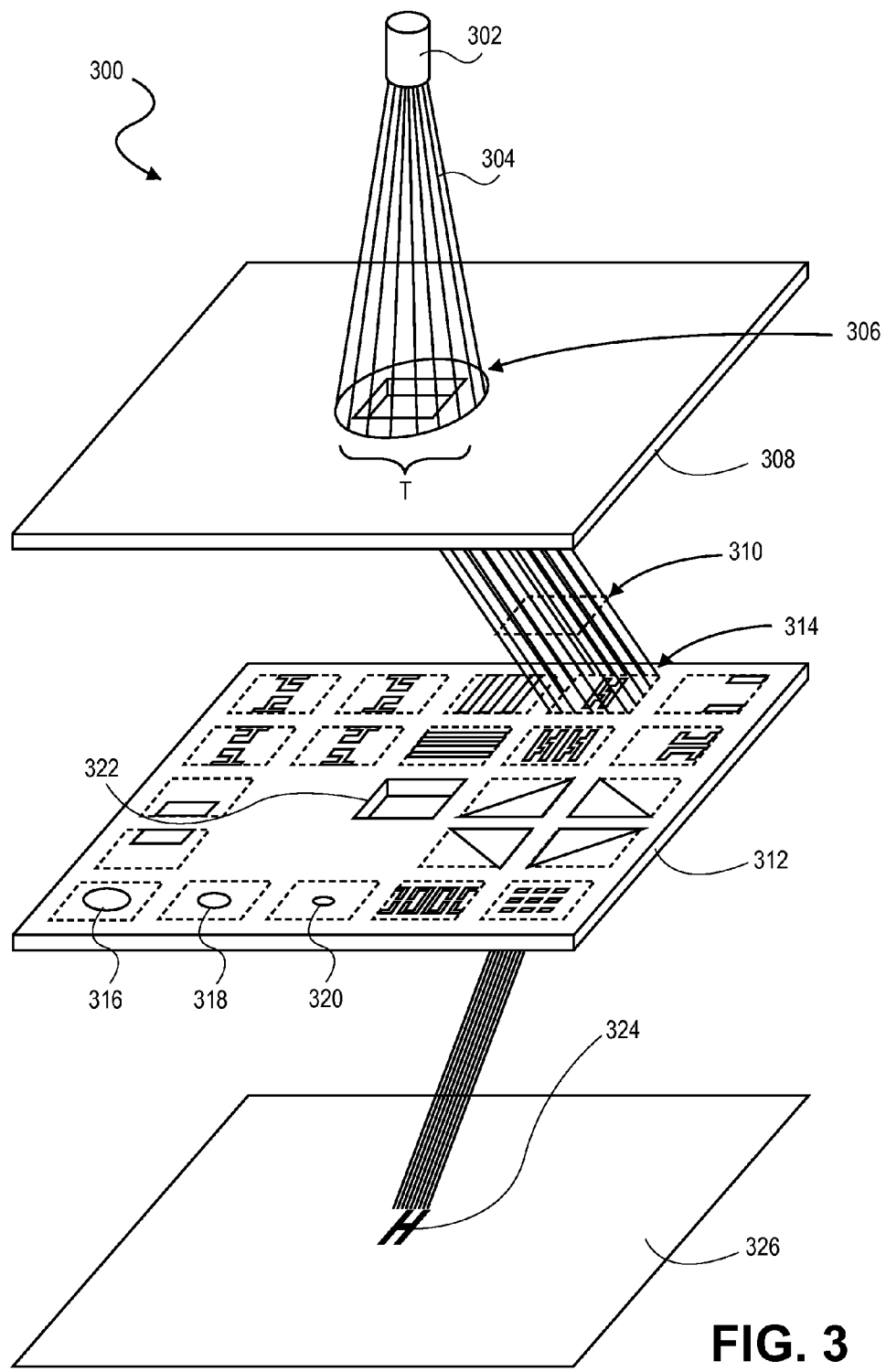
FIG. 3 illustrates a charged particle beam writer with character projection (CP) capability.

FIG. 3 illustrates a charged particle beam writer 300 which has character projection (CP) capability. As shown, a particle or electron beam source 302 provides a particle or electron beam 304 to a first mask 308 that can be formed to a rectangular shape 310 with a first aperture 306 formed in the first mask 308. The rectangular beam 310 is then directed to a second mask or stencil 312 and through a second aperture or character 314 formed in the stencil 312. The portion of the charged particle beam 310 that goes through character 314 is directed to surface 326, where it forms a pattern 324 in the shape of character 314. In this exemplary embodiment of FIG. 3, the stencil 312 also includes three circular characters of various sizes: character 316, character 318 and character 320. The stencil 312 also includes a rectangular aperture 322 for VSB shots, allowing the creation of VSB and CP shots using the same stencil 312. Currently-available CP charged particle beam systems can be used for forming patterns directly onto substrates such as silicon wafers, but are not suitable for writing reticles for creation of photomasks. Even if character projection (CP) capability was available on charged particle beam writers for reticles, the conventional mask writing methodology and systems would only be able to write pre-designated diameters of circles, based on the sizes of circular CP characters on the stencil, such as character 316, character 318 and character 320 on stencil 312. Using the conventional methodology, the number of alternative sizes would be limited by the number of characters that could be placed on a stencil.

Figure 5A:
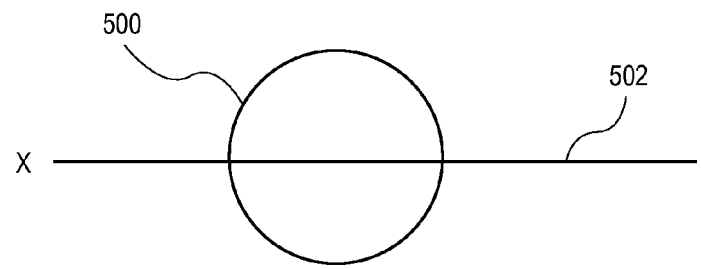
FIG. 5A illustrates a pattern formed by a shot of a circular character projection character.
Figure 5B:
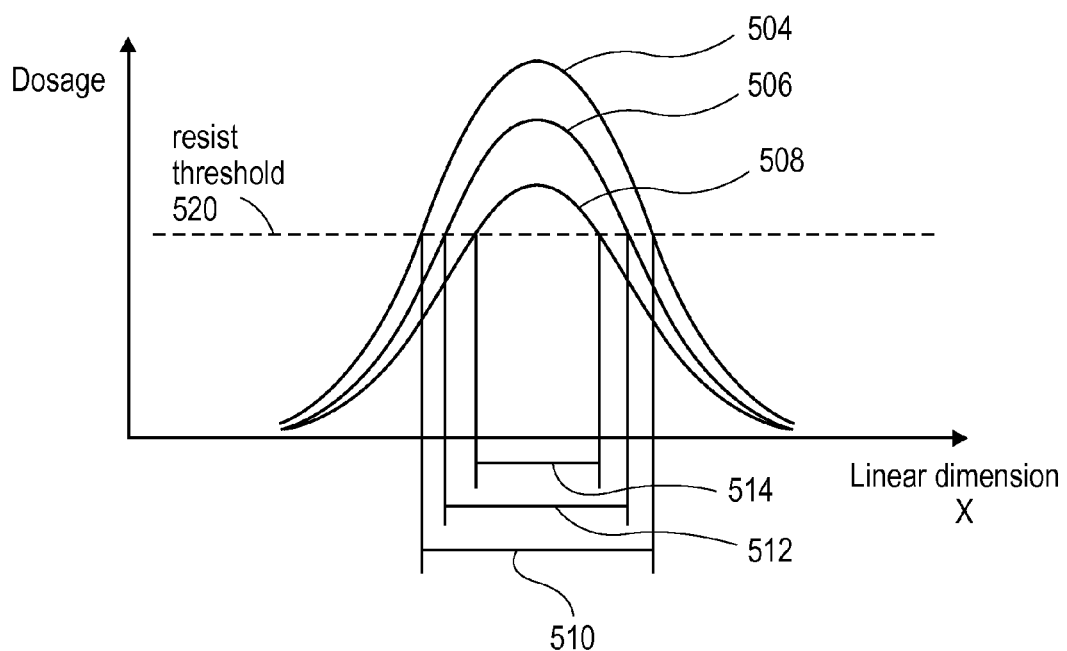
FIG. 5B illustrates the effect of varying dosage on the size of the pattern on the surface registered by the character projection shot of FIG. 5A.

FIGS. 5A&B illustrate an example of how a single CP character may be used to form circles of varying diameters on a surface, by varying the shot dosage. FIG. 5A shows a nominal circular pattern 500 that can be formed on a surface using a CP charged particle beam writer such as that shown in FIG. 3 using a circular CP character such as character 318. A line 502 bisects the circular pattern 500. FIG. 5B shows the dosage distribution along the line 502 through pattern 500. The horizontal axis corresponds to the linear position along line 502, and the vertical axis shows the dosage. Three dosage distributions are shown: for shot dosage 504, shot dosage 506 and shot dosage 508. Each of the dosage curves illustrates the Gaussian distribution of the charged particle beam. FIG. 5B also shows a resist threshold level 520, which is the dosage level above which a pattern will be registered on the surface. As shown, the greatest shot dosage 504 will register a pattern of size 510, the intermediate shot dosage 506 will register a pattern of medium size 512, and the lowest shot dosage 508 will register a pattern of smallest size 514. Since the pattern is circular, this size difference is a diameter difference. Thus, different diameter circles can be formed on the surface using a single CP character by varying the shot dosage.

Figure 4:
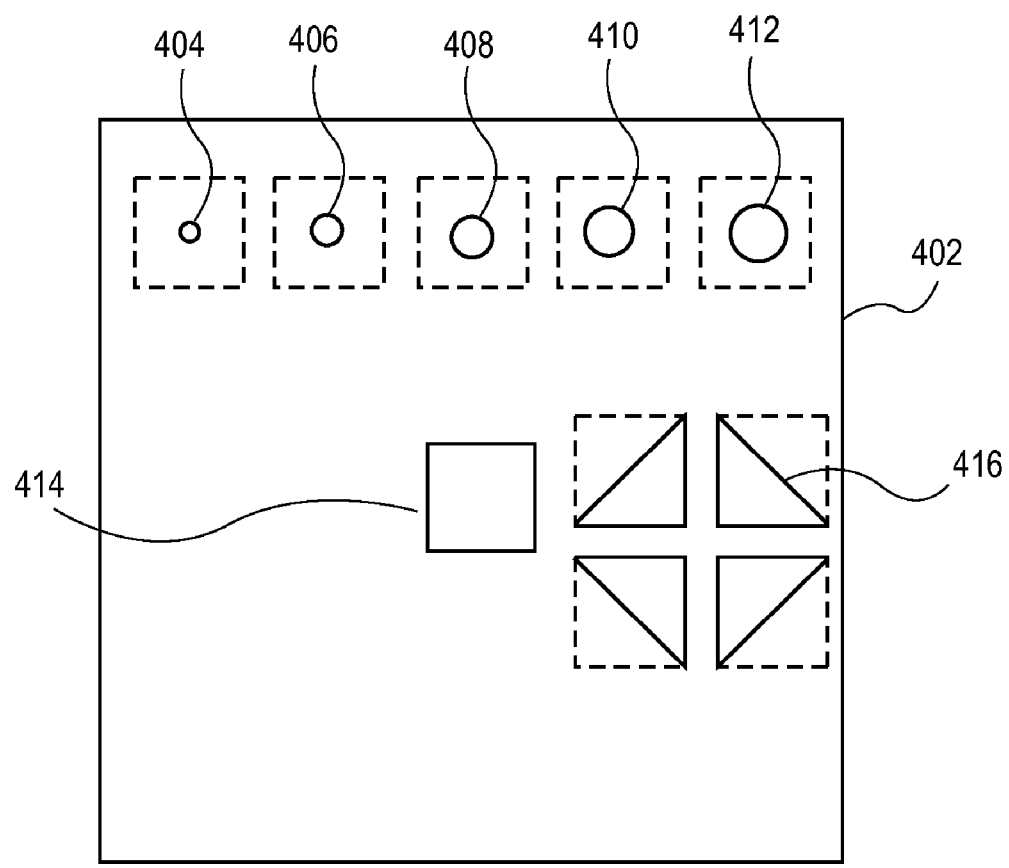
FIG. 4 illustrates a character projection stencil containing a plurality of circular characters.
Figure 6:
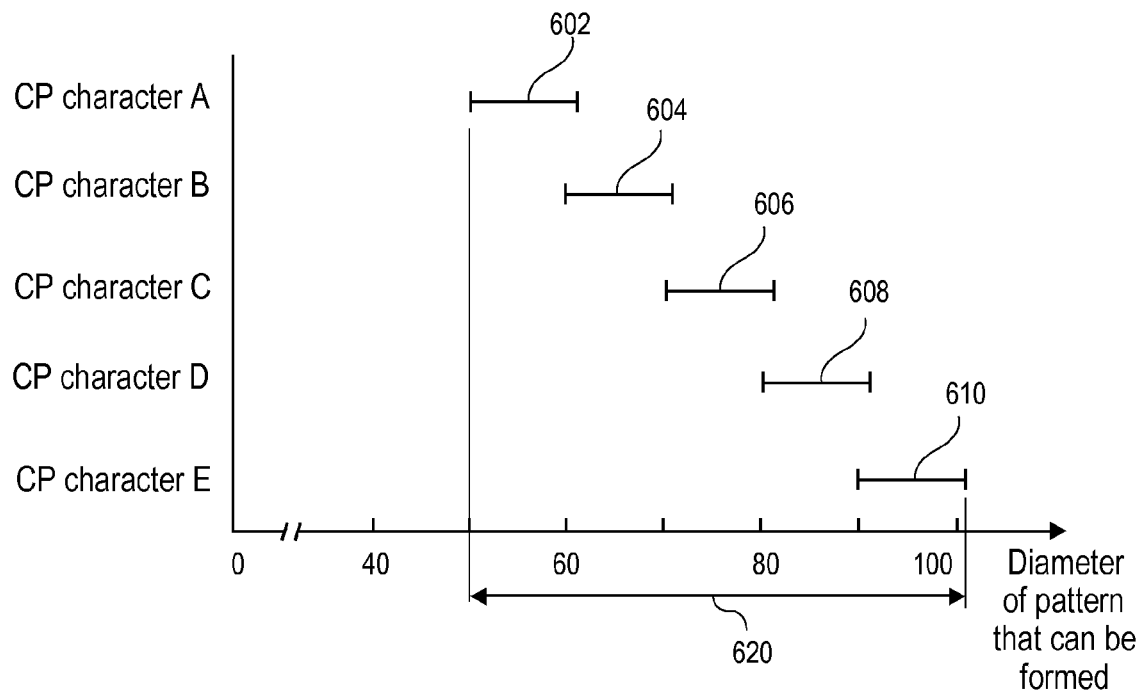
FIG. 6 illustrates a chart showing the range of diameters of circular patterns than can be formed on a surface using a set of circular character projection characters.

FIG. 4 illustrates an exemplary embodiment of a CP stencil containing a plurality of circular CP characters of varying sizes. Stencil 402 contains five circular CP characters of different sizes: character 404, character 406, character 408, character 410 and character 412. Additionally, stencil 402 contains a rectangular aperture 414 for VSB shots and a set of triangular apertures 416, also for VSB shots. In some embodiments of the present invention stencil 402 may not contain triangular apertures 416, but may contain only rectangular and circular apertures. Each circular CP character 404, 406, 408, 410, and 412 can form circular patterns in a range of diameters on a surface, by varying the shot dosage as described above. By appropriately choosing the sizes of the circular CP characters during the design of the stencil, circular patterns in a wide range of sizes can be formed on a surface. FIG. 6 illustrates a chart showing an example of how a group of five circular CP characters of appropriate sizes may be used to form circles in a large range of sizes on a surface. In the example of FIG. 6, CP character "A" can form circular patterns in a range of sizes 602. CP character "B" can form circular patterns in a range of sizes 604. CP character "C" can form circular patterns in a range of sizes 606. CP character "D" can form circular patterns in a range of sizes 608. CP character "E" can form circular patterns in a range of sizes 610. As shown, the range of sizes 602 overlaps the range of sizes 604, the range of sizes 604 overlaps the range of sizes 606, the range of sizes 606 overlaps the range of sizes 608, and the range of sizes 608 overlaps the range of sizes 610. Therefore, a circular pattern of any size in the total range 620 can be formed using only five CP characters. It is not strictly necessary that the range of diameters overlap to any significant degree, but only that the largest circle that can be formed with one circular CP character is at least as large as the smallest circle that can be formed using the next-larger circular CP character. In other embodiments, it is not necessary that the range of possible diameters be continuous. The available sizes of circular patterns which can be formed using characters on the stencil 402 may be a plurality of discontinuous ranges of sizes.

Figure 9:
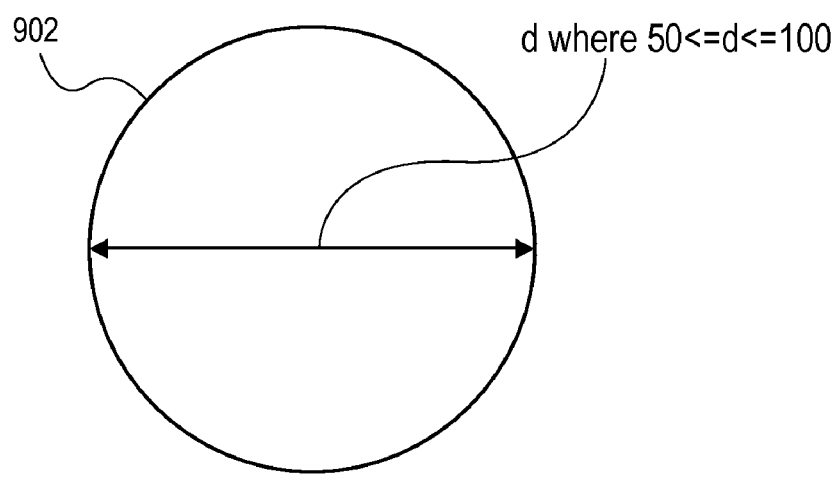
FIG. 9 illustrates a circular pattern that can be created on a surface using a parameterized glyph.

Two-dimensional maps of dosages known to be generated on a surface by single charged particle beam shots or combinations of charged particle beam shots are called glyphs. Each glyph may have associated with it the position and shot dosage information for each of the charged particle beam shots comprising the glyph. A library of glyphs may be pre-computed and made available to fracturing or mask data preparation functions. Glyphs may also be parameterized. FIG. 9 illustrates an example of a circular pattern on a surface which represents a set of patterns that can be formed by a parameterized glyph. The parameter of the glyph 902 is its diameter "d", where "d" may be any value between 50 and 100 units. In one embodiment, the glyph may be calculated using a set of circular CP characters which, using variable shot dosage, can generate any dosage map representing circular patterns within the size range of 50 to 100 units.

It should be noted that, as is common in integrated circuit design, a two-dimensional shape, such as a circle, refers to a shape on the semiconductor wafer as viewed from top-down. In the case of contacts and vias, the actual three-dimensional manufactured shapes may be cylindrical or nearly cylindrical.

The methods set forth herein for forming circles on surfaces such as reticles using either VSB shots or circular CP characters may also be used to form patterns directly on substrates such as silicon wafers, using maskless direct write. It should be noted that MEEF is not an issue for direct writing.

Figure 11A:
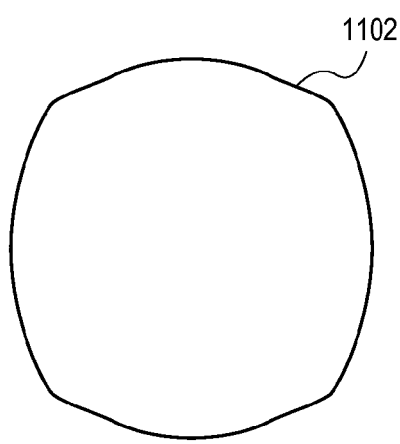
FIG. 11A illustrates a desired near-circular pattern.
Figure 11B:
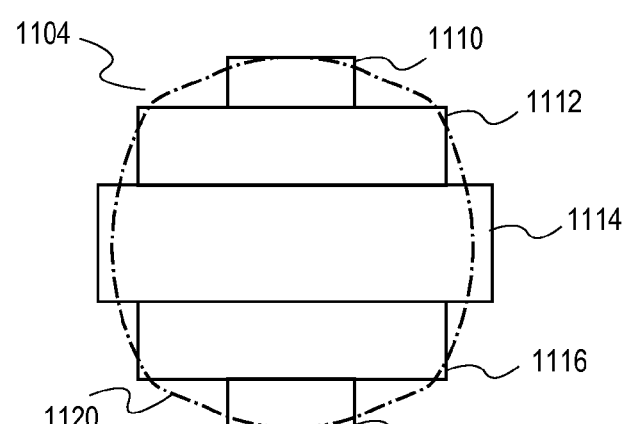
FIG. 11B illustrates a set of non-overlapping VSB shots that can form the pattern of FIG. 11A.

The techniques of the present disclosure may also be used when the desired pattern to be formed on a surface is nearly-circular. FIG. 11A illustrates a nearly-circular pattern 1102 that may be a desired mask pattern for a contact or via. The pattern 1102 may, for example, be a desirable trade-off between MEEF and maximal contact area between the conductive material in the layer above the contact or via and the conductive material in the layer below the contact or via. FIG. 11B illustrates a five-shot group 1104 of VSB shots, in this example non-overlapping VSB shots, that can, with proper dosages, register a pattern on the surface which is close to the desired pattern 1102. Shot group 1104 consists of shot 1110, shot 1112, shot 1114, shot 1116 and shot 1118, which in this exemplary embodiment are rectangular shots of differing widths and heights. Dosages of the shots in shot group 1104 may vary with respect to each other. The pattern registered on resist coating the surface is shape 1120, which is equivalent to shape 1102, within a pre-determined tolerance. The example illustrates how nearly-circular patterns can be formed with the techniques of this disclosure.

The formation of circles on a surface can be approximated by a non-circular shape such as a polygon. Where a circle is desired on a surface or on a substrate such as a silicon wafer, the result may be a near-circle, such as a curvilinear shape which closely resembles a circle.

Figure 10:
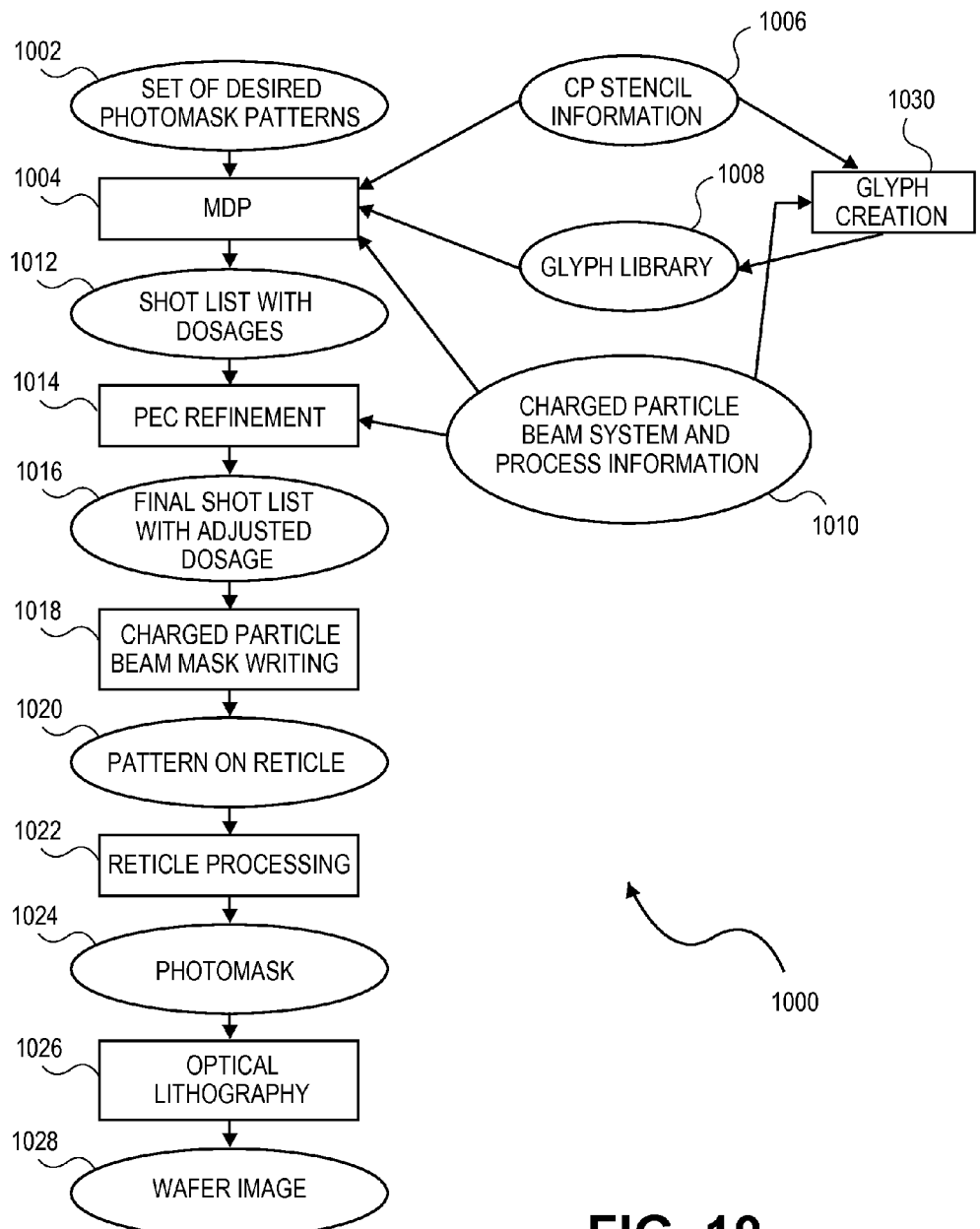
FIG. 10 illustrates a conceptual flow diagram of manufacturing a reticle and fabricating an integrated circuit using an exemplary method of the current disclosure.

FIG. 10 is a conceptual flow diagram 1000 of an embodiment of the present disclosure for preparing a surface for use in fabricating a substrate such as an integrated circuit on a silicon wafer using optical lithography. The input for this process is a set of desired patterns 1002 to be formed on a photomask. The set of desired patterns 1002 may include a set of desired circular patterns, which are received by an input device. Step 1004 is a mask data preparation (MDP) step. MDP step 1004 may include a fracturing operation in which shot overlap may or may not be allowed, and in which other-than-normal dosage assignment is allowed. The fracturing may comprise determining a set of VSB shots, or may comprise determining a CP character and shot dosage, using the CP stencil information 1006, or may comprise determining a combination of VSB and CP shots. MDP step 1004 may also comprise selecting one or more glyphs from a glyph library 1008 to match a desired pattern. The selected glyphs may include parameterized glyphs. MDP step 1004 may also include an operation of determining the optimal method—VSB shots, a CP character shot, or a glyph—to use for each desired pattern. The optimization criteria may, for example, be to minimize shot count or charged particle beam system writing time. MDP step 1004 may also comprise using particle beam simulation to calculate the pattern that will be formed on the surface by a set of shots, and may also comprise revising the set of shots and recalculating the pattern if the calculated pattern differs from the desired pattern by more than a predetermined tolerance. Particle beam simulation may include any of forward scattering, resist diffusion, Coulomb effect, backward scattering, loading, fogging, and etching simulation, and may use charged particle beam system and process information 1010. MDP step 1004 outputs to an output device a determined shot list 1012 comprising the combined list of VSB and CP shots, and shots from glyphs. The shots in the shot list 1012 contain dosage information. In step 1014 proximity effect correction (PEC) and/or other corrections may be performed or corrections may be refined from earlier estimates. Step 1014 uses shot list 1012 as input and produces a final shot list 1016 in which the shot dosages have been adjusted. The final shot list 1016 is used by the charged particle beam system 1018 to expose resist with which the reticle has been coated, thereby forming a set of patterns 1020 on the resist. After various processing steps 1022, the reticle is transformed into a photomask 1024. The photomask 1024 is used in an optical lithography machine 1026 to transfer the set of desired patterns, such as circular patterns, on the photomask 1024 onto a substrate such as a silicon wafer, creating a wafer image 1028, from which the silicon wafer is produced.

A glyph creation step 1030 in FIG. 10 calculates dosage maps either from a CP character shot with a particular dosage or from a set of VSB shots having possibly various dosages. Glyph creation step 1030 uses CP stencil information 1006. The CP stencil information may include information about a plurality of differently-sized circular CP characters. Glyph creation step 1030 may also comprise using charged particle beam simulation to calculate the glyph. Particle beam simulation of the glyph may include any of forward scattering, resist diffusion, Coulomb effect, and etching simulation, and may use charged particle beam system and process information 1010. Glyph creation step 1030 may also comprise calculation of a set of glyphs to create a parameterized glyph.

The various flows described in this disclosure may be implemented using general-purpose computers with appropriate computer software as computation devices. Due to the large amount of calculations required, multiple computers or processor cores may also be used in parallel. In one embodiment, the computations may be subdivided into a plurality of 2-dimensional geometric regions for one or more computation-intensive steps in the flow, to support parallel processing. In another embodiment, a special-purpose hardware device, either used singly or in multiples, may be used to perform the computations of one or more steps with greater speed than using general-purpose computers or processor cores. The optimization and simulation processes described in this disclosure may include an iterative optimization process such as with simulated annealing, or may constitute solely a constructive, greedy, deterministic or other process without iterative improvement.

All references in this disclosure to circles should be interpreted to also include near-circles. Similarly, all references to circular patterns, circular apertures, circular characters, or circular CP characters should be interpreted to also include nearly-circular patterns, apertures, characters, or CP characters. Also, all references to cylinder should be interpreted to include near-cylinder, and all references to cylindrical should include nearly-cylindrical.

While the specification has been described in detail with respect to specific embodiments, it will be appreciated that those skilled in the art, upon attaining an understanding of the foregoing, may readily conceive of alterations to, variations of, and equivalents to these embodiments. These and other modifications and variations to the present system and method for manufacturing circular patterns on a surface or method for manufacturing an integrated circuit or method and system for fracturing or mask data prepraration may be practiced by those of ordinary skill in the art, without departing from the spirit and scope of the present subject matter, which is more particularly set forth in the appended claims. Furthermore, those of ordinary skill in the art will appreciate that the foregoing description is by way of example only, and is not intended to be limiting. Thus, it is intended that the present subject matter covers such modifications and variations as come within the scope of the appended claims and their equivalents.

What is claimed is:

1. A method for manufacturing a semiconductor device on a substrate comprising:
   providing a photomask, wherein the photomask comprises a plurality of circular patterns of different sizes, and wherein the photomask has been manufactured using a character projection (CP) charged particle beam system using a technique selected from the group consisting of 1) forming the plurality of circular patterns on the photomask from a plurality of circular CP characters of different sizes in a stencil, and 2) forming the plurality of circular patterns on the photomask from a single CP character in a stencil, by varying dosage of the charged particle beam system; and
   using optical lithography to form a plurality of circular patterns on the substrate using the plurality of circular patterns in the photomask.

2. The method of claim 1 wherein the plurality of circular patterns on the substrate includes patterns for contacts or vias for the semiconductor device.

3. A method for manufacturing a semiconductor device on a substrate comprising:
   providing a photomask having circular patterns, wherein the circular patterns on the photomask have been manufactured using a plurality of variable shaped beam (VSB) shots from a charged particle beam system, wherein shots in the plurality of shots were allowed to overlap each other, wherein the union of the plurality of shots was different than the desired patterns, and wherein the dosages of the shots in the plurality of shots varied with respect to each other; and
   using optical lithography to form a plurality of circular patterns on the substrate using the circular patterns in the photomask.

4. A method for fracturing or mask data preparation for charged particle beam lithography comprising:
   inputting a set of patterns to be formed as circles on a surface;
   determining a set of shots that can form the set of circular patterns on the surface, wherein the dosages of the shots in the set of shots may vary with respect to each other; and
   outputting the set of shots, including the dosages.

5. The method of claim 4 further comprising inputting a set of glyphs, and wherein in the step of determining, the set of shots includes a glyph.

6. The method of claim 5 wherein the glyph is a parameterized glyph.

7. The method of claim 4 wherein the set of shots includes a character projection (CP) character shot.

8. The method of claim 6 wherein the set of shots includes shots which will form a plurality of circular patterns of different sizes using a single CP character, by using different dosages.

9. The method of claim 4 wherein the step of determining comprises determining variable shaped beam (VSB) shots for a selected pattern in the set of input patterns, and wherein the VSB shots are allowed to overlap each other, and wherein the union of the set of shots is different than the selected pattern.

10. The method of claim 4 wherein the step of determining comprises determining non-overlapping VSB shots for a selected pattern in the set of input patterns, and wherein the union of the set of shots is different than the selected pattern.

11. The method of claim 4 wherein the determined set of shots is subsequently used to manufacture a circle on a photomask, and wherein the photomask is later used to manufacture a cylinder on a wafer.

12. A system for fracturing or mask data preparation for use with charged particle beam lithography comprising:
   an input device capable of receiving a set of circular patterns to be formed on a reticle;
   a computation device capable of determining a set of shots that can be used to form the set of circular patterns, wherein the dosages of the shots may vary with respect to each other; and
   an output device capable of receiving the determined set of shots, including the dosages.

13. The system of claim 12 wherein the set of shots includes a shot using a circular character projection (CP) character.

14. The system of claim 12 wherein the shots determined to form a selected pattern in the set of circular patterns comprise a plurality of variable shaped beam (VSB) shots, and wherein the plurality of VSB shots may overlap each other, and wherein the union of the plurality of VSB shots is different than the selected pattern.

15. The system of claim 12 further comprising a glyph library, wherein the computation device is capable of determining a set of shots that may include a glyph.

* * * * *

UNITED STATES PATENT AND TRADEMARK OFFICE
CERTIFICATE OF CORRECTION

| | | |
|---|---|---|
| PATENT NO. | : 8,017,288 B2 | Page 1 of 1 |
| APPLICATION NO. | : 12/540321 | |
| DATED | : September 13, 2011 | |
| INVENTOR(S) | : Fujimura et al. | |

It is certified that error appears in the above-identified patent and that said Letters Patent is hereby corrected as shown below:

In column 10, line 26, delete "claim 6" and insert --claim 4--.

Signed and Sealed this
Twenty-fifth Day of October, 2011

David J. Kappos
*Director of the United States Patent and Trademark Office*